Dec. 1, 1959 R. D. MOHLER 2,915,708
TRANSITOR OSCILLATOR WITH HARMONICALLY TUNED OUTPUT CIRCUIT
Filed Aug. 15, 1955
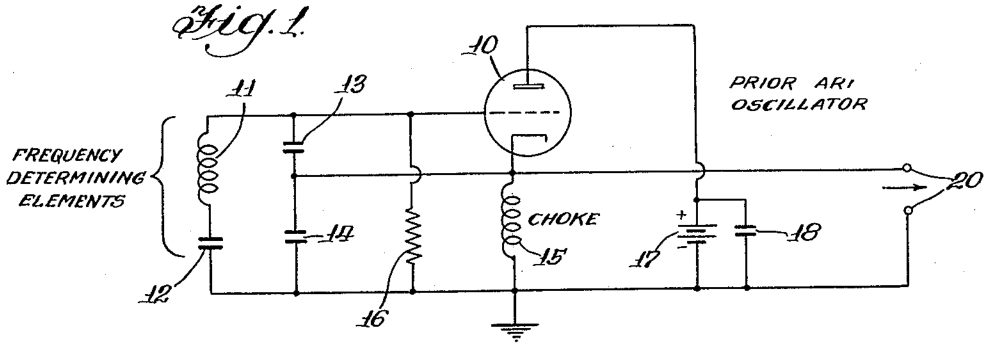
Fig. 2.
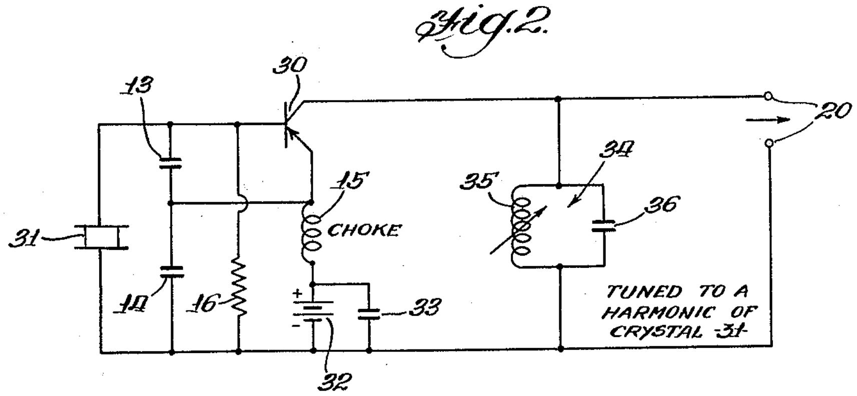
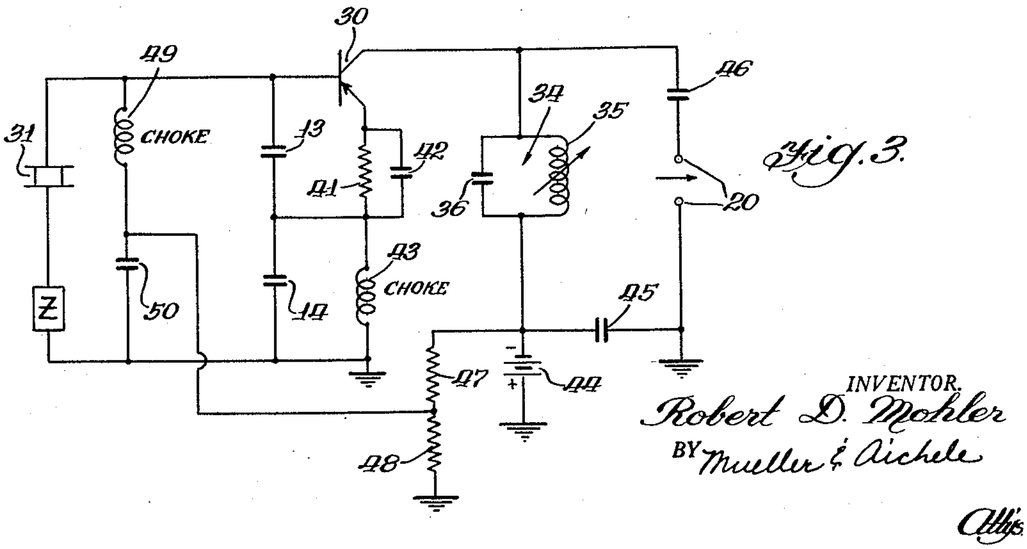
Fig. 3.
INVENTOR.
Robert D. Mohler
BY Mueller & Aichele
Att'ys.

2,915,708
Patented Dec. 1, 1959

2,915,708

TRANSISTOR OSCILLATOR WITH HARMONICALLY TUNED OUTPUT CIRCUIT

Robert D. Mohler, Elmhurst, Ill., assignor to Motorola, Inc., Chicago, Ill., a corporation of Illinois Application August 15, 1955, Serial No. 528,297

5 Claims. (Cl. 331—76)

The present invention relates generally to oscillator circuits, and more particularly it relates to a crystal-controlled transistor oscillator suitable for use as a fixed-frequency heterodyne oscillator in communication wave-signal receiving apparatus.

With the advent of the transistor, considerable efforts are being made to convert electronic equipment from the vacuum tube type to the type using transistors. Rather serious problems have been encountered in such conversion in the provision of a suitable transistor heterodyne oscillator that will operate with a sufficiently high degree of frequency stability and in the frequency range generally used in many type of communication equipment. For example, such heterodyne oscillators are usually required to produce an injection voltage in the 25–50 megacycle frequency range in portable communication equipment, and the like. A requirement for such oscillators is that they must operate with a high degree of frequency stability, and a piezo-electric crystal is most often used for this purpose. However, it is not practically feasible to operate such a crystal directly in the range mentioned above, and overtone operation of such crystals has been attempted. For example, oscillator circuits have been devised using surface barrier transistors in a grounded base circuit to provide crystal-controlled oscillation in the 25–50 megacycle frequency range, with the crystal circuits being tuned so that the crystals are mechanically vibrated at their third overtone. It was found, however, that such circuits were inherently unstable, and that it was practically impossible to duplicate a desired frequency from one unit to another. Also, this type of oscillator was found to have a tendency to operate at frequencies other than the desired frequency as the circuit gain changed, which can readily occur from one transistor to another.

The above disadvantages have been found to exist to a great extention in most types of crystal oscillators using overtone crystal oscillation, both in the transistor or vacuum tube versions of such oscillators. In transistor oscillators, the disadvantages are further aggravated by the comparatively large changes in loop phase shift which occur with voltage and temperature changes. Although these problems are not insoluble, and the solution usually involves merely a refinement of the circuit details, such refinements lead to arrangements that are too complex in their construction and adjustment to be commercially practical and also lead to designs that are unreliable over any length of time.

A general object of the present invention is to provide an improved oscillator for producing an output signal having a frequency harmonically related to the frequency of the frequency-determining means of the oscillator, and which is not subject to the drawbacks and disadvantages of the overtone type of crystal oscillators described above.

Another object of the invention is to provide a stable crystal-controlled transistor oscillator capable of producing an output signal having a frequency that is a harmonic of the fundamental frequency of the crystal.

Yet another object of the invention is to provide such an oscillator that is eminently simple in its construction and operation, which is economical to build and which is commercially practical from every standpoint.

A feature of the invention is the provision of a stable high-frequency oscillator circuit including a three-electrode discharge device in which one of the electrodes is connected to a return path to complete an oscillator circuit for a frequency-determining means connected to the other two electrodes, and which return path includes a parallel resonant circuit across which may be obtained an output signal harmonically related to the frequency of the frequency-determining means.

Another feature of the invention is the provision of a stable high-frequency crystal controlled oscillator circuit in which the crystal oscillates at its fundamental frequency, and which includes a three-electrode discharge device with a tuned circuit in the return path of the crystal, which tuned circuit constitutes a low impedance for the fundamental frequency and across which may be obtained a multiple frequency signal.

Yet another feature of the invention is the provision of a stable high-frequency oscillator circuit including a transistor and a piezo-electric crystal, which crystal is operated at its fundamental frequency for stability purposes, and in which a frequency multiplied signal is obtained in the return path of the crystal by means of a parallel resonant circuit tuned to such a harmonic or multiple frequency.

The above and other features of the invention, which are believed to be new, are set forth with particularity in the appended claims. The invention itself, however, together with further objects and advantages thereof may best be understood by reference to the following description when taken in conjunction with the accompanying drawing in which:

Fig. 1 shows a prior art oscillator and is useful in illustrating an operative principle of the oscillator of the present invention;

Fig. 2 shows a simplified but operative version of the oscillator of the invention; and Fig. 3 is a more detailed representation of the oscillator of the invention.

The invention provides an oscillator circuit which comprises a discharge device having an input electrode, an output electrode and a common electrode. A frequency determining means which may, for example, be a piezo-electric crystal, has one side connected to the input electrode. A pair of impedance elements, such as capacitors, are series-connected across the frequency determining means. A connection extends from the common junction of the impedance elements to the output electrode of the discharge device. A further connection is provided between the common electrode of the discharge device and the other side of the frequency determining means, and this latter connection includes a parallel-resonant network. The parallel-resonant network is adapted to be tuned to a multiple of the fundamental frequency of the frequency determining means, and it constitutes a low impedance return path at the fundamental frequency to cause the oscillator to oscillate at that frequency. Finally, means is provided for deriving a stable frequency-multiplied output signal across the parallel-resonant network.

The schematic diagram of Fig. 1 includes an electron discharge device 10 having a control electrode connected to a point of reference potential or ground through a series-resonant network including an inductance coil 11 and series-connected capacitor 12, this network constituting the primary frequency determining means of the oscillator. The frequency determining means is shunted by a pair of series connected capacitors 13, 14, and the common junction of these capacitors is connected to the cathode of device 10, the cathode being returned to ground through a choke coil 15. The control electrode of device 10 is connected to ground through a biasing resistor 16, and the anode of the device is connected to the positive terminal of a source of unidirectional potential 17, the source being shunted by a by-passing capacitor 18. A pair of output terminals 20 is connected across choke coil 15.

The oscillator in Fig. 1 is a Clapp oscillator or modified Colpitts. Device 10 is connected somewhat as a cathode-follower. The cathode of device 10 constitutes the output electrode, the control grid, the input electrode, and the anode the common electrode of the oscillator. The frequency of oscillation is determined primarily by the frequency determining means 11, 12, and feedback is obtained from the output or cathode electrode by virtue of its connection to the common junction of capacitors 13 and 14. This connection develops a signal across capacitor 14 of the proper phase to aid the signal impressed on the control electrode of device 10 so as to sustain oscillation in the circuit.

In the circuit of Fig. 2, the electron discharge device 10 is replaced by a transistor 30, and the series-resonant frequency determining means 11, 12 is replaced by a piezoelectric crystal 31. Crystal 31 is shunted by the capacitors 13, 14 and has one side connected to the base electrode of the transistor. Resistor 16 connects the base electrode to a point of reference potential or ground for biasing purposes, and the emitter electrode is connected to the positive terminal of a source of biasing potential 32 through the choke coil 15, with the source being shunted by a by-passing capacitor 33. In this embodiment, the output terminal 20 is connected to the collector electrode, and the collector is returned to the point of reference potential or ground through a parallel resonant network 34 which comprises an inductance coil 35 shunted by a capacitor 36.

In the embodiment of Fig. 2, the base electrode of transistor 30 constitutes the input electrode, the emitter constitutes the output electrode, and the collector the common electrode, insofar as the oscillator is concerned. The common collector electrode is returned to the other side of crystal 31 through the parallel-resonant network 34 and the ground connection. This parallel-resonant network is tuned to a selected harmonic of the fundamental frequency of crystal 31 and constitutes a low impedance return path at the fundamental frequency of the crystal. This enables the oscillator to oscillate at the fundamental crystal frequency, which enhances the stability of the circuit. A frequency multiplied harmonic signal of a desired high frequency is derived across the resonant network 34 and impressed on output terminals 20.

The circuit of Fig. 2 constitutes a high frequency oscillator capable of more stable operation and of delivering more power at the harmonic frequency than prior art oscillators such as a crystal oscillator operating on an overtone of the crystal. Tuning of network 36, 35 does not affect the oscillator frequency so long as its resonant frequency is sufficiently high so that the network constitutes a low impedance at the oscillator frequency. This is an important feature of the invention, since it assures stable operation at a preselected frequency despite changes in the output circuit. This is a distinct advantage over the overtone type of circuit in which changes in the resonant frequency of the output produces unwanted changes in the frequency of the oscillator.

The network 34 is tuned to provide maximum amplitude of the output signal at the selected harmonic frequency and any mistuning of the network merely decreases the amplitude of the output signal but does not affect the oscillator frequency. To obtain a desired oscillator output frequency, crystal 31 is selected to have, for example, one-third the desired frequency, and network 34 tuned to the third harmonic. It is also possible to modulate the oscillator frequency by inserting a variable impedance (Z) in series with crystal 31. This impedance may, for example, be a variable capacity microphone, pickup or the like.

A constructed embodiment of the invention was designed to operate in the 25–50 megacycle range. A grounded collector transistor-amplifier such as shown in Fig. 2, was used with the crystal operated on the inductive side of series resonance. Crystals were provided in the frequency range of 8–17 megacycles, and network 34 was adapted to be tuned in the frequency range of 24–51 megacycles. In the constructed embodiment, the following constants were used. These, of course, are listed merely by way of example and depend largely on the type of transistor used in the circuit.

| | |
|---|---|
| Capacitor 13 | 50 micromicrofarads. |
| Capacitor 14 | 15 micromicrofarads. |
| Choke coil | 20 microhenries. |
| Resistor 16 | 22 kiloohms. |
| Resistor 32 | 3 volts. |

It is found with a 50% plus or minus change in supply voltage that the frequency varied plus or minus .00007%, and with a temperature change of 25° to 60° centigrade that the frequency varied .001%. (The latter variation is compensated in the circuit of Fig. 3 which will be described.) The oscillator frequency was found to be practically independent of output tuning and changes in the transistors produced little effect upon the operating frequency.

The circuit of Fig. 3 is generally similar to that of Fig. 2, and like components have been designated by like numerals.

The base electrode of transistor 30 in the embodiment of Fig. 3 is connected to one side of crystal 31, and the emitter electrode is returned to ground through a biasing resistor 41, shunted by a capacitor 42 and through a choke coil 43. The collector is connected to the negative terminal of a source of unidirectional biasing potential 44 through the parallel resonant tuned network 34, and this source is by-passed to ground through a capacitor 45. The collector electrode is also connected to the ungrounded output terminal 20 to a coupling capacitor 46. Source 44 is shunted by a voltage divider including resistors 47 and 48, and the common junction of these resistors is connected through a choke coil 49 to the base electrode of transistor 30, this junction being by-passed to ground through a capacitor 50.

In the embodiment of Fig. 3, the alternating current connections are similar to the circuit of Fig. 2, with the collector electrode being returned to ground for alternating-current through the tuned network 34 and capacitor 45. In the latter embodiment, the collector is biased negatively by source 44 and the base is also biased negatively, but to a lesser extent, by the potentiometer voltage divider 47, 48. The emitter is self-biased by the network 41, 42. With this arrangement, any variations in the D.C. current flow through the transistor, due to temperature changes or changes in transistor parameters, sets up a compensating bias across resistor 41 so as to maintain the same operating parameters despite such changes.

The invention provides, therefore, an improved high frequency highly stable oscillator in which the frequency determining means may be operated at the fundamental frequency and a stable frequency multiplied signal is obtained in the common return path of the oscillator across a parallel resonant network in that path that is tuned to a harmonic of the oscillator frequency.

I claim:

1. An oscillator circuit including in combination, a transistor having emitter, base and collector electrodes;

a piezo-electric crystal element having one side connected to said base electrode; a pair of capacitors series-connected across said crystal; a connection extending from the common junction of said capacitors to said emitter electrode; means including a parallel-resonant network connected between said collector electrode and the other side of said crystal, said parallel-resonant network being adapted to be tuned to a harmonic of the fundamental frequency of said crystal and constituting a low-impedance path at said fundamental frequency to cause said crystal to oscillate at said fundamental frequency; and means for deriving an output signal across said parallel-resonant network having a frequency harmonically related to said fundamental frequency.

2. An oscillator circuit including in combination, a discharge device having an input electrode, an output electrode and a common electrode; frequency-determining means having one side connected to said input electrode; first and second impedance means series-connected across said frequency-determining means; a connection extending from the common junction of said first and second impedance means to said output electrode; means including a parallel-resonant network connected between said common electrode and the other side of said frequency-determining means, said parallel-resonant network being adapted to be tuned to a multiple of the fundamental frequency of said frequency-determining means and constituting a low-impedance path at said fundamental frequency to cause the oscillator to oscillate at such fundamental frequency; and means for obtaining a frequency-multiplied signal from said parallel-resonant network.

3. An oscillator circuit including in combination a transistor device having an input electrode, an output electrode and a common electrode; a series-resonant frequency-determining means having one side connected to said input electrode; a pair of capacitors series-connected across said frequency-determining means; a connection extending from the common junction of said capacitors to said output electrode; means including a parallel-resonant network connected between said common electrode and the other side of said frequency-determining means, said parallel-resonant network being adapted to be tuned to a harmonic of the fundamental frequency of said frequency-determining means and constituting a low impedance path at said fundamental frequency to cause the oscillator to oscillate at such fundamental frequency; and means for deriving an output signal across said parallel-resonant network having a frequency harmonically related to said fundamental frequency.

4. The oscillator defined in claim 3 in which said frequency-determining means is formed by a piezo-electric crystal element operating on the inductive side of series resonance.

5. An oscillator circuit including in combination, a transistor having emitter, base and collector electrodes; a piezo-electric crystal element having one side connected to said base electrode and having its other side connected to a point of reference potential; a pair of capacitors series-connected across said crystal; a connection extending from the common junction of said capacitors to said emitter electrode and including a resistance-capacity biasing network; means for connecting said emitter electrode to said point of reference potential; means for conductively connecting said base electrode to a negative biasing source; means including a parallel-resonant network connected between said collector electrode and said point of reference potential, said parallel-resonant network being adapted to be tuned to a harmonic of the fundamental frequency of said crystal and constituting a low-impedance path at said fundamental frequency to cause said crystal to oscillate thereat; and means for deriving an output signal across said parallel-resonant network having a frequency harmonically related to said fundamental frequency.

References Cited in the file of this patent

UNITED STATES PATENTS

| | | |
|---|---|---|
| 2,391,386 | Bradley | Dec. 25, 1945 |
| 2,455,824 | Tellier et al. | Dec. 7, 1948 |
| 2,555,960 | Delvaux | June 5, 1951 |
| 2,770,731 | Bopp et al. | Nov. 13, 1956 |